United States Patent
Shima (10) Patent No.: US 8,741,724 B2
(45) Date of Patent: Jun. 3, 2014

(54) METHOD OF MANUFACTURING SEMICONDUCTOR DEVICE

(71) Applicant: Fujitsu Semiconductor Limited, Yokohama (JP)

(72) Inventor: Masashi Shima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/886,745

(22) Filed: May 3, 2013

(65) Prior Publication Data

US 2013/0241005 A1 Sep. 19, 2013

Related U.S. Application Data

(62) Division of application No. 12/704,745, filed on Feb. 12, 2010.

(30) Foreign Application Priority Data

Mar. 19, 2009 (JP) .................................. 2009-68233

(51) Int. Cl.
*H01L 21/336* (2006.01)

(52) U.S. Cl.
USPC ........................................................ 438/301

(58) Field of Classification Search
CPC ... H01L 21/82; H01L 27/0928; H01L 29/267; H01L 29/66
See application file for complete search history.

(56) References Cited

U.S. PATENT DOCUMENTS

| 5,482,878 A | * | 1/1996 | Burger et al. ................. 438/217 |
| 5,783,457 A | | 7/1998 | Hsu |
| 6,020,228 A | | 2/2000 | Asakura |
| 6,566,719 B1 | | 5/2003 | Asakura |

(Continued)

FOREIGN PATENT DOCUMENTS

| EP | 1 401 024 A2 | 3/2004 |
| JP | 07-94734 A | 4/1995 |

(Continued)

OTHER PUBLICATIONS

Extended European Search Report dated May 31, 2013, issued in corresponding European Patent Application No. 10152536.8 (8 pages).

(Continued)

*Primary Examiner* — Charles Garber
*Assistant Examiner* — Andre' C Stevenson
(74) *Attorney, Agent, or Firm* — Westerman, Hattori, Daniels & Adrian, LLP (57) ABSTRACT

A semiconductor device includes first, second and isolation regions; a first insulating film and gate electrode formed over the first region; a second insulating film and gate electrode formed over the second region; a first sidewall formed on a side of the first gate electrode and a second sidewall formed on a side of the second gate electrode; first source and drain regions formed adjacent opposite sides of the first gate electrode; second source region adjacent to the one side of the first gate electrode and overlapping the first source region, an impurity concentration of the second source region being different from an impurity of the first source region; a second drain region overlapping the first drain region and overlapping the first gate electrode; and a metal silicide formed on the first source region and the first drain region.

8 Claims, 5 Drawing Sheets

(56) References Cited

U.S. PATENT DOCUMENTS

| | | | |
|---|---|---|---|
| 7,166,893 B2 * | 1/2007 | Taniguchi et al. | 257/336 |
| 7,195,983 B2 * | 3/2007 | Chindalore et al. | 438/301 |
| 2004/0259302 A1 | 12/2004 | Ito et al. | |
| 2007/0138592 A1 | 6/2007 | Chang et al. | |
| 2007/0166969 A1 | 7/2007 | Yanagi et al. | |
| 2008/0160704 A1 | 7/2008 | Jang | |
| 2008/0283922 A1 | 11/2008 | Yamashita et al. | |

FOREIGN PATENT DOCUMENTS

| | | |
|---|---|---|
| JP | 10-098183 A | 4/1998 |
| JP | 11-214686 A | 8/1999 |
| JP | 2000-357792 A | 12/2000 |
| JP | 2004-221223 A | 8/2004 |
| JP | 2007-027622 A | 2/2007 |
| JP | 2008-288366 A | 11/2008 |
| TW | 317653 | 10/1997 |
| TW | 425692 B | 3/2001 |

OTHER PUBLICATIONS

Taiwanese Office Action dated Jan. 11, 2013, issued in corresponding Taiwanese Patent Application No. 99103322, with English translation (11 pages).

Japanese Office Action dated Apr. 16, 2013, issued in corresponding Japanese Patent Application No. 2009-068233, w/ partial English translation.

* cited by examiner

METHOD OF MANUFACTURING SEMICONDUCTOR DEVICE

CROSS REFERENCES TO RELATED APPLICATIONS

This application is a divisional application of U.S. patent application Ser. No. 12/704,745 filed Feb. 12, 2010, and is based upon and claims the benefits of priority from Japanese Patent Application No. 2009-68233 filed on Mar. 19, 2009, the entire contents of which being incorporated herein by reference.

FIELD OF THE INVENTION

The present invention relates to methods of manufacturing semiconductor devices including MOS transistors.

DESCRIPTION OF THE RELATED ART

With regard to semiconductor integrated circuit devices, miniaturization of MOS transistors in accordance with a scaling law has been in progress. A transistor having a gate insulating film below a gate electrode is called a MOS transistor. Although the operation speed of MOS transistors increases with size reduction of MOS transistors, a short channel effect tends to occur easily. A channel region is doped with a channel impurity with a conductivity type opposite to that of a source/drain region so that the threshold value is adjusted to an appropriate value. A known structure for preventing a short channel effect is such that an extension region that defines a shallow joint is formed on the inner side of a low-resistance source/drain region so as to decrease the effective joint depth of source/drain related to carrier movement. Furthermore, a pocket region (hollow region) with a conductivity type opposite to that of the source/drain region is also formed around the extension region.

In a semiconductor integrated circuit, a high-voltage-drive MOS transistor is required in addition to a low-voltage-drive MOS transistor.

In a high-frequency power-amplification MOS transistor, the drain voltage fluctuates by about twice as much as a bias point or more with respect to input high-frequency power. For this reason, a MOS transistor requires a high drain breakdown voltage. A power amplifier fitted in a mobile device is normally used in a range of several hundred MHz to several GHz. Therefore, excellent high-frequency characteristics are also in demand. Not only in mobile devices but also in high-output, high-frequency power amplifiers, high breakdown voltage and excellent high-frequency characteristics are sometimes required.

In MOS transistors that require a high breakdown voltage and excellent high-frequency characteristics, it is desired that the on-resistance of the transistor be reduced and that the gain at a high frequency be enhanced. When a depletion layer between an effective channel region, in which the current is controlled by a gate voltage, and the drain region is widened, a high breakdown voltage is achieved. In addition, the drain-side channel resistance is lowered, thereby enhancing high-frequency output power. Known examples of MOS structures include a laterally-diffused MOS transistor structure in which a lateral impurity density distribution in a channel region is modulated so that the lateral impurity density decreases from the midsection of the channel region towards the drain region, and an extended-drain MOS transistor structure in which an overlapping length between a low-density-drain (LDD) region and a gate electrode is increased so that the depletion layer is widened by the effect of the gate voltage.

When ion injection is performed using a photo-resist mask prior to the formation of a gate electrode so as to form a channel-impurity-increased region in an area overlapping the gate electrode, the number of masks and the number of steps increase.

Japanese Laid-Open Patent Publication No. 11-214686 proposes an example in which the channel region has a low impurity density in the midsection thereof and a high impurity density in opposite side sections thereof and also in which the impurity density of the channel region in the depth direction is of a two-level retrograde type. In this example, a source/drain region with a high impurity density is formed deeper than the high-density channel region.

Japanese Laid-Open Patent Publication No. 2000-357792 proposes a method that includes forming gate electrodes or dummy electrodes on both sides of and in parallel with a gate electrode, forming symmetric impurity regions below the gate electrode by performing diagonal ion injection from both sides of the gate electrode so that active regions on both sides of the gate electrode are overshadowed by the other gate electrodes or the dummy electrodes, and forming asymmetric impurity regions below the gate electrode by performing diagonal ion injection from only one direction.

SUMMARY

According to one aspect of the invention, a method of manufacturing a semiconductor device includes, forming isolation region defining a first region and a second region, injecting a first impurity of a first conductivity type into the first region and the second region, forming a first gate insulating film and a first gate electrode over the first region, forming a second gate insulating film and a second gate electrode over the second region, forming a first mask layer over a first portion of the second region exposing a second portion of the second region and the first region, and injecting a second impurity of the first conductivity type into the semiconductor substrate from a direction diagonal to a surface of the semiconductor substrate.

An object and advantages of an embodiment of the invention will be realized and attained by elements and combinations of elements particularly pointed out in the claims. It is to be understood that both the foregoing general description and the following detailed description are explanatory and are not restrictive of the invention, as claimed.

DESCRIPTION OF THE PREFERRED EMBODIMENTS

FIGS. 1A to 1H, 1X and 1Y illustrate a method of manufacturing a semiconductor device according to a first embodiment. A low-breakdown-voltage CMOS transistor including a logic circuit, an intermediate-breakdown-voltage CMOS transistor for input/output, and a high-breakdown-voltage NMOS transistor for high-frequency power amplification are formed on a semiconductor substrate. The following description will mainly be focused on the intermediate-breakdown-voltage CMOS transistor and the high-breakdown-voltage NMOS transistor.

Figure 1A:
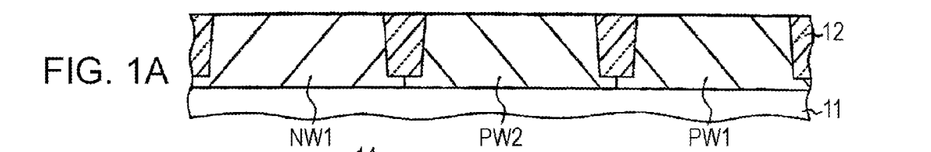
FIGS. 1A to 1H, 1X and 1Y illustrate a method of manufacturing a semiconductor device according to a first embodiment.

Referring to FIG. 1A, shallow-trench-isolation (STI) element-isolation regions 12, for example, are formed in a silicon substrate 11. For example, a silicon oxide film is formed by thermally oxidizing a surface of the silicon substrate 11, and a silicon nitride film is deposited on the silicon oxide film by chemical vapor deposition (CVD). A photo-resist pattern that covers active regions is formed on the silicon nitride film, and the silicon nitride film and the silicon oxide film are etched, thereby forming a hard mask. Using the hard mask as an etching mask, the silicon substrate 11 is etched to a depth of about 250 nm to 400 nm, for example 300 nm, thereby forming trenches. After forming a silicon oxide film by thermally oxidizing the trench surfaces, the silicon oxide film is deposited and embedded in the trenches by high-density-plasma (HDP) CVD. The silicon oxide film on the hard mask is then removed by chemical mechanical polishing (CMP), and the exposed silicon nitride film therebelow is removed by etching using, for example, hot phosphoric acid. Then, the exposed silicon oxide film therebelow is removed by etching using, for example, diluted hydrofluoric acid. In this manner, active regions defined by the element-isolation regions 12 are obtained.

A photo-resist pattern with openings corresponding to active regions for forming p-type wells is formed, and then a p-type impurity B is ion-injected with, for example, an acceleration energy of 200 keV and a dosage of $3\times10^{13}$ cm$^{-2}$, thereby forming p-type wells PW1 and PW2. Using a photo-resist mask that covers the p-type wells PW1 and PW2, an n-type impurity P is ion-injected with, for example, an acceleration energy of 400 keV and a dosage of $3\times10^{13}$ cm$^{-2}$, thereby forming an n-type well NW1. Although one n-type well NW1 and two p-type wells PW1 and PW2 are shown in the drawings, more n-type wells NW and p-type wells PW may be formed. The p-type well PW1 on the right side of FIG. 1A corresponds to an active region where a high-breakdown-voltage NMOS transistor is to be formed, the p-type well PW2 in the middle corresponds to an active region where an intermediate-breakdown-voltage NMOS transistor is to be formed, and the n-type well NW1 on the left side corresponds to an active region where an intermediate-breakdown-voltage PMOS transistor is to be formed.

Figure 1B:
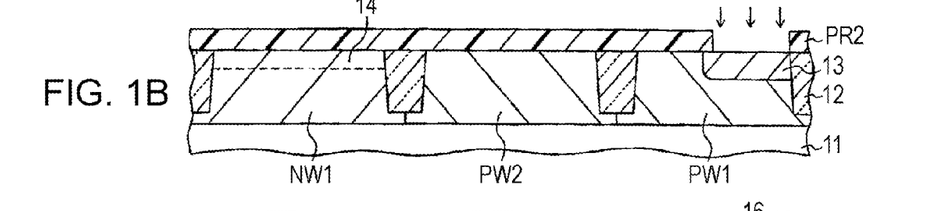

Referring to FIG. 1B, a photo-resist mask PR2 that covers regions other than a low-density-drain (LDD) region of the high-breakdown-voltage NMOS transistor is formed, and an n-type impurity P is ion-injected with, for example, an acceleration energy of 50 keV to 200 keV and a dosage of about $1\times10^{13}$ cm$^{-2}$ to $3\times10^{13}$ cm$^{-2}$, thereby forming an n-type LDD region 13. Subsequently, the photo-resist mask PR2 is removed.

A photo-resist mask that covers the NMOS transistor areas but exposes the PMOS transistor area is formed, and an n-type impurity As is ion-injected with, for example, an acceleration energy of 80 keV to 130 keV and a dosage of about $1\times10^{12}$ cm$^{-2}$ to about $2\times10^{12}$ cm$^{-2}$, thereby forming an n-type channel dose region 14. Subsequently, the photo-resist mask is removed.

After forming the LDD region 13 and the channel dose region 14, an annealing process for activating the ion-injected impurities is performed, for example, at about 1000° C. for about 10 seconds. The ion-injected impurities are thus activated and become diffused.

Figure 1C:
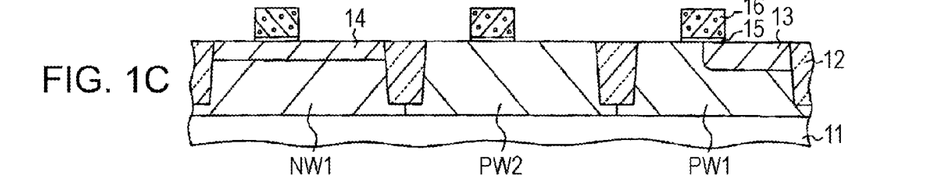

Referring to FIG. 1C, a silicon oxide film with a thickness of, for example, about 7 nm is formed by thermally oxidizing the surface of the active regions. In an active region where a low-breakdown-voltage MOS transistor is to be formed, the formed silicon oxide film is temporarily removed by a diluted hydrofluoric acid solution, and another silicon oxide film with a thickness of, for example, about 1 nm to 2 nm is formed by thermal oxidation. If three or more kinds of silicon oxide films with different thicknesses are to be formed, the same thermal oxidation process is repeated, starting from a thicker silicon oxide film. In an area where a thick thermally-oxidized film is to be formed, the thickness is set in view of an expected increase in thickness in a subsequent thermal oxidation process. The silicon oxide films may be made into silicon oxide-nitride films by incorporating nitrogen into the surface thereof, or a high-dielectric insulating film, such as a hafnium oxide film, may be stacked on the silicon oxide films. In this manner, gate insulating film 15 is formed.

A polysilicon film is deposited to a thickness of, for example, 100 nm on each gate insulating film 15 by CVD. A dry etching process is performed by using a photo-resist mask formed on the polysilicon films as a mask, so as to pattern gate electrodes 16. Prior to the patterning, an n-type impurity may be ion-injected into the gate electrodes of the NMOS transistors and a p-type impurity may be ion-injected into the gate electrode of the PMOS transistor. The gate electrode 16 of the high-breakdown-voltage MOS transistor has a gate length of, for example, about 500 nm and overlaps the LDD region 13 by 100 nm to 250 nm, which is about 20% to 50% of the gate length. The gate length of the intermediate-breakdown-voltage transistor is, for example, about 350 nm.

Figure 1D:
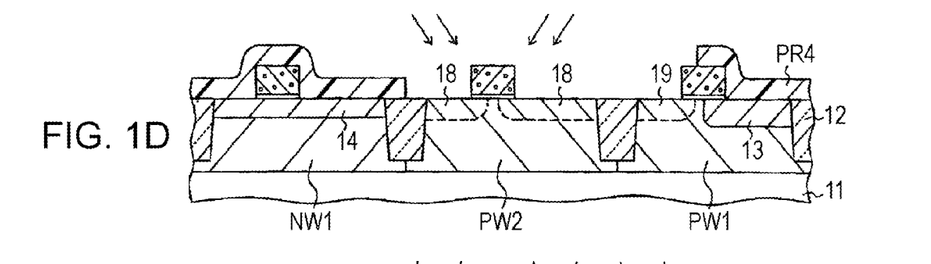

Referring to FIG. 1D, a photo-resist mask PR4 that covers the entire PMOS transistor area and the drain region of the high-breakdown-voltage NMOS transistor is formed, and a p-type impurity is ion-injected diagonally into the NMOS transistor areas so as to adjust the impurity density in the channel region. For example, a p-type impurity B is ion-injected with, for example, an acceleration energy of 20 keV to 50 keV, or specifically, for example, 30 keV, and a dosage of about $5\times10^{12}$ cm$^{-2}$ from multiple symmetrical directions relative to the normal of the substrate, or for example, from an angle of 25° to 60° in four directions relative to the direction of the normal of the substrate.

Figure 1E:
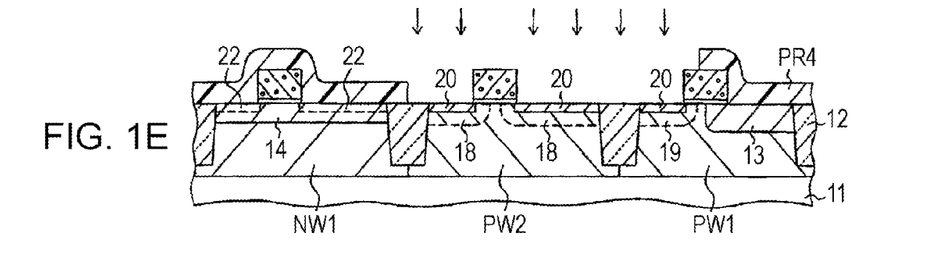
Figure 1F:
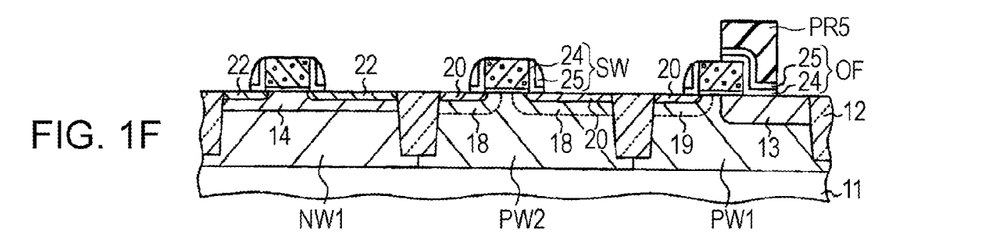
Figure 1G:
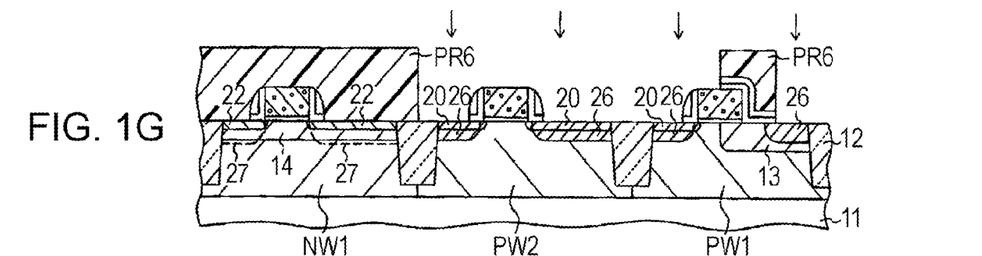
Figure 1H:
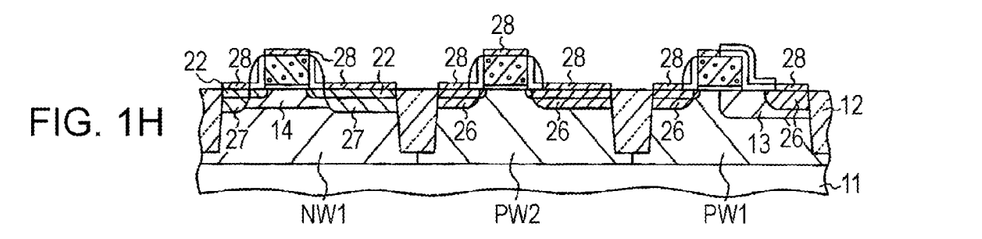
Figures 1X, 1Y:
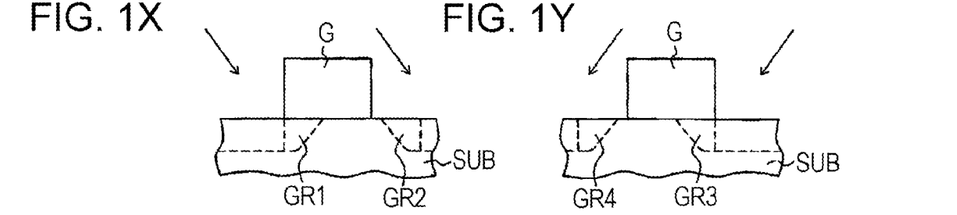

FIG. 1X schematically illustrates an ion injection process performed diagonally from the upper left corner towards the lower right corner of the drawing. A polysilicon gate electrode G is formed on a silicon substrate SUB. In FIG. 1X, a gate insulating film is not shown. The injected ions penetrating the silicon substrate SUB also penetrate the polysilicon gate electrode G. To simplify the description, the distance by which the ions penetrate polysilicon gate electrode G is substantially equal to the distance by which the ions penetrate the silicon substrate SUB. In the case of a diagonal ion injection process, the ions entering the side surfaces of the gate electrode G pass through only a portion of the thickness of the gate electrode G. Ions passing through the gate electrode G where the thickness of the gate electrode G is less due to the angle of injection, enter into the silicon substrate SUB. Therefore, due to the ions passing through the gate electrode G, a dosage gradient region GR1, in which the injection depth and the dosage gradually decrease toward the center of the gate electrode G, is formed in the silicon substrate SUB below the gate electrode G. At the right side of the gate electrode G, ions pass through a portion of the thickness of the gate electrode G and through the right side surface of the gate electrode G so as to enter the silicon substrate SUB. Therefore, a dosage gradient region GR2 in which the injection depth and the dosage gradually increase is formed in area region overshadowed by the gate electrode G.

FIG. 1Y schematically illustrates an ion injection process performed diagonally from the upper right corner towards the lower left corner of the drawing. Ions diagonally enter the right side surface of the gate electrode G so that a dosage gradient region GR3 in which the injection depth and the dosage gradually decrease toward the center of the gate electrode G is formed in the silicon substrate SUB below the gate electrode G. At the left side of the gate electrode G, a dosage gradient region GR4 in which the injection depth and the dosage gradually increase away from the center of the gate electrode G is formed in an area overshadowed by the gate electrode G.

For example, when the diagonal ion injection process is performed twice from the source side and the drain side of the gate electrode G, the impurity density distribution obtained is equivalent to the sum total of the dosage gradient regions GR1 to GR4 depicted in FIGS. 1X and 1Y.

Referring to FIG. 1D, for the intermediate-breakdown-voltage NMOS transistor, the diagonal ion injection process is performed symmetrically from both sides of the gate electrode 16, thereby forming symmetric channel dose regions 18. With the channel impurity density at both sides being relatively high, a threshold value for the transistor is determined. For the high-breakdown-voltage NMOS transistor, the diagonal injection process is performed from the source side, thereby forming a channel dose region 19 in which the dosage is high at the source side and gradually decreases toward the drain. The drain is covered with a photo-resist mask PR4.

By performing the diagonal ion injection using the gate electrodes 16 as masks, an impurity density distribution in which the depth and the impurity density are made to gradually decrease from the gate edges toward the center of the gates is formed below each gate electrode 16. In the high-breakdown-voltage MOS transistor, a channel impurity density distribution in which the depth and the impurity density are made to gradually decrease from the source-side gate edge towards the drain is formed. Since the channel impurity density is low at the drain side, the channel resistance is lowered. As a result, the on-resistance of the transistor is reduced, thereby enhancing high-frequency output power.

Referring to FIG. 1E, by using the photo-resist mask PR4 for forming channel dose regions, an n-type impurity P is ion-injected vertically with, for example, an acceleration energy of 30 keV and a dosage of about $1 \times 10^{13}$ cm$^{-2}$, thereby forming n-type extension regions 20. The drain region of the high-breakdown-voltage NMOS transistor is covered by the photo-resist mask PR4.

By using a photo-resist mask that covers the entire NMOS transistor areas, a p-type impurity BF is ion-injected vertically into the PMOS transistor area with, for example, an acceleration energy of 10 keV to 20 keV and a dosage of about $3 \times 10^{13}$ cm$^{-2}$ to $7 \times 10^{13}$ cm$^{-2}$, thereby forming p-type extension regions 22.

Referring to FIG. 1F, a silicon oxide film 24 with a thickness of about 10 nm and a silicon nitride film 25 with a thickness of about 30 nm are deposited over the entire surface of the semiconductor substrate by plasma CVD at a substrate temperature of, for example, 450° C. By using a photo-resist mask PR5 that partly covers a gate-electrode-side area in the drain region of the high-breakdown-voltage NMOS transistor, the silicon nitride film 25 and the silicon oxide film 24 are anisotropically etched by anisotropic dry etching, such as reactive ion etching, so that sidewall spacers SW remain on sidewalls of each gate electrode 16. In the high-breakdown-voltage NMOS transistor, an insulating drain-offset region OF extending from the gate electrode 16 to a portion of the drain region is formed on the drain side in place of a sidewall spacer. Subsequently, the photo-resist mask PR5 is removed.

Referring to FIG. 1G, a photo-resist mask PR6 that covers the PMOS transistor area and the insulating drain-offset region OF of the high-breakdown-voltage NMOS transistor is formed, and an n-type impurity P is ion-injected with, for example, an acceleration energy of 10 keV and a dosage of about $5 \times 10^{15}$ cm$^{-2}$, thereby forming low-resistance source/drain regions 26. Subsequently, the photo-resist mask PR6 is removed. The low-resistance source/drain regions 26 are each offset from the corresponding gate electrode 16 by a certain distance that is greater than the sidewall-spacer width.

Likewise, a photo-resist mask that covers the NMOS transistor areas is formed, and a p-type impurity B is ion-injected with, for example, an acceleration energy of 5 keV and a dosage of $5 \times 10^{15}$ cm$^{-2}$, thereby forming low-resistance source/drain regions 27.

An annealing process is performed, for example, for one second at 1000° C. so as to activate the ion-injected impurities.

Referring to FIG. 1H, a nickel film is deposited over the entire surface of the silicon substrate, and an annealing process is performed at 400° C. to 500° C. so as to carry out a silicidation reaction. Unreacted nickel films are removed, so that nickel-silicon films 28 are obtained in the source/drain regions and on the silicon surface of the gate electrodes 16. The annealing process may be performed more than once.

In the first embodiment, a diagonal ion injection is performed on the high-breakdown-voltage MOS transistor so as to form a channel impurity density distribution in which the impurity density is high at the source side and is low at the drain side and also to form low-resistance drain regions that are each offset from the corresponding gate electrode 16 by a certain distance. Accordingly, a high-breakdown-voltage NMOS transistor with low on-resistance and a depletion layer that may be readily widened is formed.

FIGS. 2A to 2D illustrate a method of manufacturing a semiconductor device according to a second embodiment. By performing the same step as that depicted in FIG. 1A, STI-type element-isolation regions 12 are formed in a silicon substrate 11, and a p-type well PW1, a p-type well PW2, and an n-type well NW1 are formed in an active region for a high-breakdown-voltage NMOS transistor, an active region for an intermediate-breakdown-voltage NMOS transistor, and an active region for an intermediate-breakdown-voltage PMOS transistor, respectively.

Figure 2A:
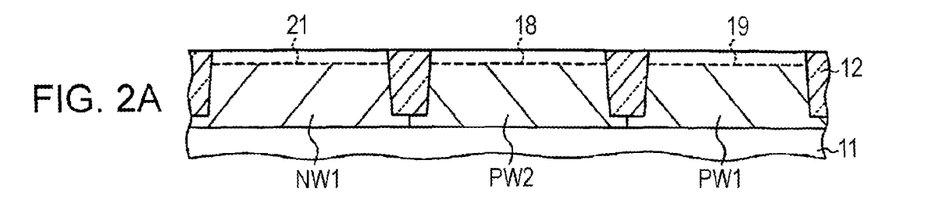
FIGS. 2A to 2D illustrate a method of manufacturing a semiconductor device according to a second embodiment.

Referring to FIG. 2A, a p-type impurity is ion-injected into the p-type wells PW1 and PW2 so as to form p-type channel dose regions 18 and 19 that make up NMOS-transistor channel regions. For example, a p-type impurity B is ion-injected with, for example, an acceleration energy of 30 keV to 35 keV and a dosage of $3 \times 10^{12}$ cm$^{-2}$ to $4 \times 10^{12}$ cm$^{-2}$ into the intermediate-breakdown-voltage NMOS transistor area and the high-breakdown-voltage NMOS transistor area.

Since two kinds of threshold values, e.g., high and low threshold values, are set for the intermediate-breakdown-voltage NMOS transistor, when two kinds of p-type channel impurity density distributions, e.g., high and low density distributions, are to be formed, a low-channel-impurity-density distribution corresponding to the low threshold value is formed in the high-breakdown-voltage NMOS transistor area. For example, the p-type impurity B is ion-injected with, for example, an acceleration energy of 30 keV to 35 keV and a dosage of $3\times10^{12}$ cm$^{-2}$ to $4\times10^{12}$ cm$^{-2}$ into a first intermediate-breakdown-voltage NMOS transistor area and the high-breakdown-voltage NMOS transistor area and with, for example, an acceleration energy of 30 keV to 35 keV and a dosage of $5\times10^{12}$ cm$^{-2}$ to $6\times10^{15}$ cm$^{-2}$ into a second intermediate-breakdown-voltage NMOS transistor area.

Likewise, an n-type impurity is ion-injected into the n-type well NW1 area so as to form a channel dose region 21.

Figure 2B:
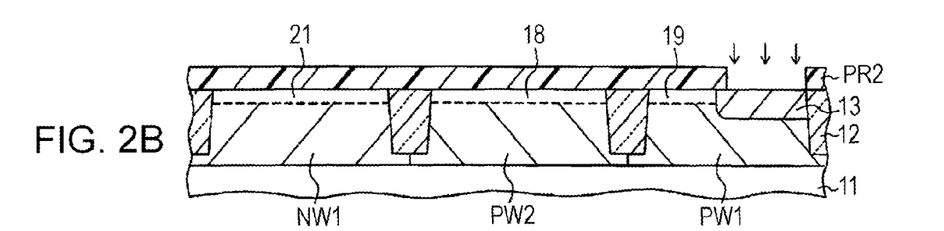

Referring to FIG. 2B, a photo-resist mask PR2 that covers regions other than an LDD region of the high-breakdown-voltage NMOS transistor is formed, and an n-type impurity P is ion-injected so as to form an n-type LDD region 13. Subsequently, the photo-resist mask PR2 is removed. After forming the LDD region 13, an annealing process for activating the ion-injected impurities is performed.

Figure 2C:
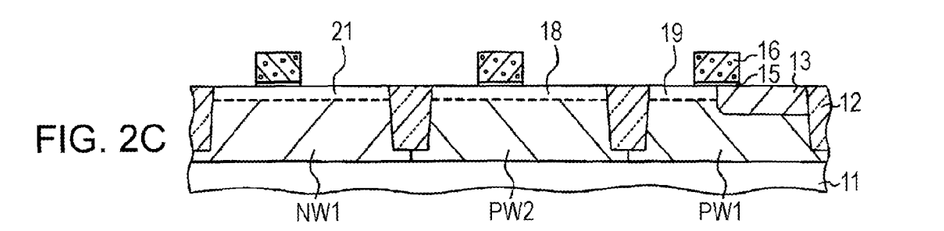

Referring to FIG. 2C, the same step as that depicted in FIG. 1C is performed so as to form gate insulating films 15 and gate electrodes 16. The gate electrode 16 of the high-breakdown-voltage MOS transistor is disposed to overlap the LDD region 13. The overlapping length is 20% to 50% of the length of the gate electrode 16.

Figure 2D:
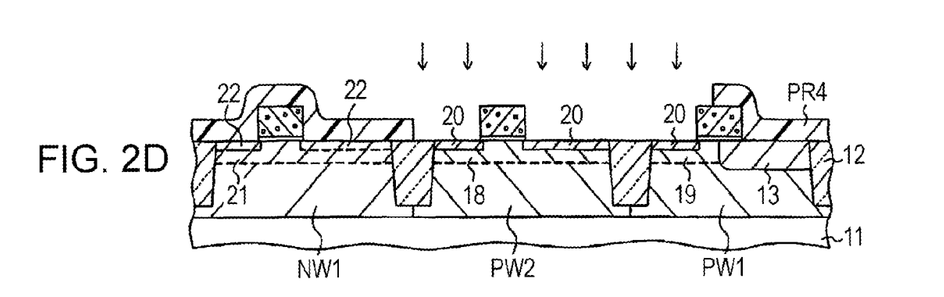

Referring to FIG. 2D, a photo-resist mask PR4 that covers the entire PMOS transistor area and the drain region of the high-breakdown-voltage NMOS transistor is formed, and an n-type impurity P is ion-injected vertically so as to form n-type extension regions 20. The high-breakdown-voltage NMOS transistor is provided with an n-type extension region 20 at the source side.

Likewise, a photo-resist mask that covers the NMOS transistor areas is formed, and a p-type impurity B is ion-injected vertically so as to form p-type extension regions 22. The p-type extension regions 22 in the intermediate-breakdown-voltage PMOS transistor are formed at the source side and the drain side.

The subsequent steps are the same as those depicted in FIG. 1F and onward.

According to the second embodiment, the channel impurity density is fixed from the source side to the drain side. Therefore, a punch-through phenomenon between the drain and the source may be minimized, thereby improving the off-breakdown-voltage. If high-frequency output power is desirably set to a high level, the offset length is preferably set to a short value so as to reduce parasitic resistance at the drain side.

Figure 3A:
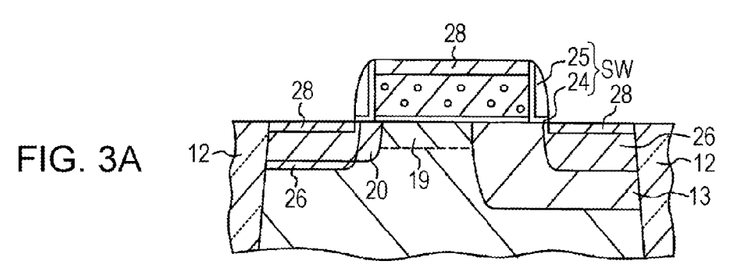
FIGS. 3A and 3B illustrate a method of manufacturing a semiconductor device according to modifications of the second embodiment.

FIG. 3A is a cross-sectional view of a semiconductor device according to a first modification of the second embodiment. After performing the steps depicted in FIGS. 2A to 2D, the step depicted in FIG. 1F is performed. In this case, the silicon oxide film 24 and the silicon nitride film 25 are deposited, and anisotropic etching is performed without forming the photo-resist mask PR5, thereby forming sidewall spacers SW. In this case, a sidewall spacer SW is formed also on the drain side of the high-breakdown-voltage NMOS transistor.

Subsequently, the step depicted in FIG. 1G is performed. The photo-resist mask PR6 in this case is configured to cover only the PMOS area, and an n-type impurity P is ion-injected into areas on the outer sides of the sidewall spacers SW of the intermediate-breakdown-voltage NMOS transistor and the high-breakdown-voltage NMOS transistor, thereby forming low-resistance source/drain regions 26. The low-resistance drain region of the high-breakdown-voltage NMOS transistor has an offset length of 0 nm. However, since the overlapping length between the LDD region 13 and the gate electrode 16 is the same as that in the first and second embodiments, the transistor structure is asymmetric. Subsequently, the silicidation step depicted in FIG. 1H is performed so as to form silicide films 28. This modification allows for reduction of on-resistance and enhancement of high-frequency output power.

Figure 3B:
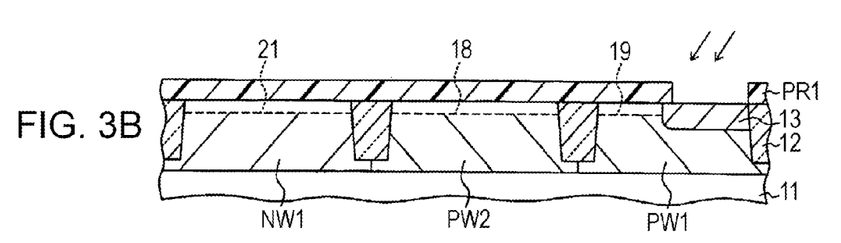

FIG. 3B is a cross-sectional view of a semiconductor substrate according to a second modification of the second embodiment. Similar to the step depicted in FIG. 2B, the photo-resist mask PR2 that covers regions other than the LDD region of the high-breakdown-voltage NMOS transistor is formed. An n-type impurity is ion-injected diagonally from the drain side towards the source side at an angle of 25° to 60° relative to the direction of the normal of the substrate, thereby forming an LDD region 13 having an impurity-density gradient in which the depth and the impurity density gradually decrease towards the source side from a source-side edge of an opening for the LDD region 13. For example, p-type impurity carriers of a p-type channel dose region 19 with a fixed density are gradually cancelled out by n-type impurity carriers for an n-type LDD region 13 having a lateral density gradient, thereby inverting the conductivity and forming an n-type LDD region 13. An area with a reduced effective channel impurity density spreads in the lateral direction. Thus, the drain-side channel resistance is lowered and the on-resistance is reduced, thereby enhancing high-frequency output power. Subsequently, the steps depicted in FIGS. 2C and 2D are performed.

FIGS. 4A to 4D are cross-sectional views of a semiconductor substrate, showing a method of manufacturing a semiconductor device according to a third embodiment. By performing the same step as that depicted in FIG. 1A, STI-type element-isolation regions 12 are formed in a silicon substrate 11, and a p-type well PW1, a p-type well PW2, and an n-type well NW1 are formed in an active region for a high-breakdown-voltage NMOS transistor, an active region for an intermediate-breakdown-voltage NMOS transistor, and an active region for an intermediate-breakdown-voltage PMOS transistor, respectively.

Figure 4A:
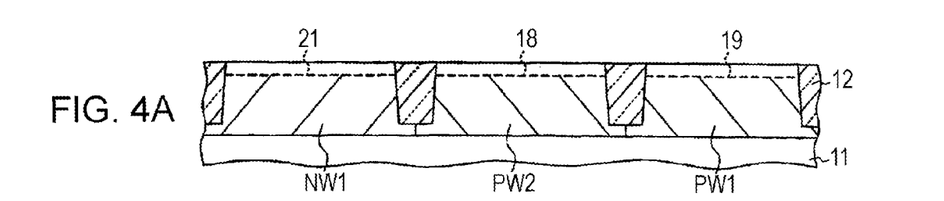
FIGS. 4A to 4D illustrate a method of manufacturing a semiconductor device according to a third embodiment.

Referring to FIG. 4A, a p-type impurity is ion-injected into the p-type wells PW1 and PW2 so as to form p-type channel dose regions 18 and 19 that make up NMOS-transistor channel regions. Likewise, an n-type impurity is ion-injected into the n-type well NW1 area so as to form a channel dose region 21.

Figure 4B:
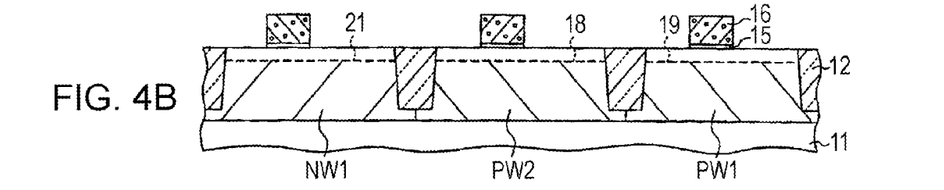

Referring to FIG. 4B, the same step as that depicted in FIG. 1C is performed so as to form gate insulating films 15 and gate electrodes 16. The channel impurity density is substantially constant from the source side to the drain side.

Figure 4C:
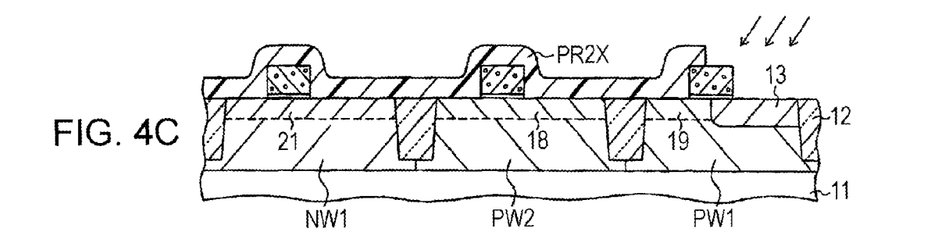

Referring to FIG. 4C, a photo-resist mask PR2x that covers regions other than an LDD region of the high-breakdown-voltage NMOS transistor is formed, and an n-type impurity is ion-injected diagonally. For example, an n-type impurity P is ion-injected from symmetrical directions inclined by 25° to 60° relative to the direction of the normal of the substrate, thereby forming an n-type LDD region 13. Subsequently, the photo-resist mask PR2x is removed.

After forming the LDD region 13, an annealing process for activating the ion-injected impurities is performed, for example, at about 1000° C. for about 10 seconds. By performing the ion injection diagonally, the LDD region 13 is given an impurity density distribution in which the impurity density gradually decreases from a gate edge towards the source side. This characteristic is the same as the characteristic in the second modification of the second embodiment. Furthermore, since the LDD region 13 is formed after forming the gate electrodes 16 by using the corresponding gate electrode 16 as a mask, the gate electrode 16 and the LDD region 13 are self-aligned with each other, thereby enhancing relative positioning accuracy.

Figure 4D:
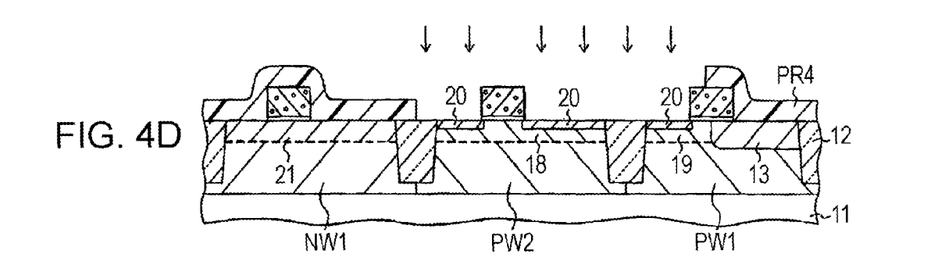

Referring to FIG. 4D, a photo-resist mask PR4 that covers the entire PMOS transistor area and the drain region of the high-breakdown-voltage NMOS transistor is formed, and an n-type impurity is ion-injected vertically so as to form n-type extension regions 20. The high-breakdown-voltage NMOS transistor is provided with an n-type extension region 20 only at the source side.

The subsequent steps are the same as those depicted in FIGS. 1F to 1H.

Since channel dose regions with a uniform density are formed in the device according to the third embodiment, a punch-through phenomenon between the drain and the source may be minimized, thereby improving the off-breakdown-voltage.

If high-frequency output power is desirably set to a high level, the offset length is preferably set to a short value so as to reduce parasitic resistance at the drain side. As in the first modification of the second embodiment, the drain side of the high-breakdown-voltage NMOS transistor may also serve as a sidewall, and a low-resistance drain region may be formed on the outer side of the sidewall.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A semiconductor device comprising;
a semiconductor substrate;
a first region and a second region are formed in the substrate, the first region and the second region include a first impurity of a first conductivity;
an isolation region formed in the substrate, the isolation region defining the first region and the second region;
a first insulating film and a first gate electrode that are formed over the first region;
a second insulating film and a second gate electrode that are formed over the second region;
a first sidewall formed on a side of the first gate electrode and a second sidewall formed on a side of the second gate electrode;
a first source region formed in the semiconductor substrate, the first source region being adjacent to one side of the first gate electrode;
a first drain region formed in the semiconductor substrate, the first drain region being adjacent to another side of the first gate electrode and separate apart from the another side of the first gate electrode;
a second source region formed in the semiconductor substrate, the second source region being adjacent to the one side of the first gate electrode and overlapping the first source region, an impurity concentration of the second source region is different from an impurity of the first source region;
a second drain region formed in the semiconductor substrate, the second drain region being overlapping the first drain region, the second drain region being overlapping the first gate electrode on a plane figure; and
a metal silicide formed on the first source region, first drain region and a portion of the first electrode, the metal silicide not formed on the remaining portion of the first electrode.

2. The semiconductor device according to claim 1, wherein the metal silicide formed on the entirety of the second gate electrode.

3. The semiconductor device according to claim 1, wherein the second drain region has a different impurity concentration from a impurity concentration of the second source region.

4. The semiconductor device according to claim 1, further comprising,
an offset region on the remaining portion and the first drain region.

5. The semiconductor device according to claim 4, wherein the offset region includes stacked films.

6. The semiconductor device according to claim 5, wherein the stacked films include a silicon oxide film and a silicon nitride film.

7. The semiconductor device according to claim 1, wherein the one side of the first gate electrode has the first sidewall and the another side of the first gate electrode does not have the first sidewall.

8. The semiconductor device according to claim 7, wherein each side of the second gate electrode has the second sidewall.

* * * * *